(12) United States Patent
Onoda et al.

(10) Patent No.: US 6,816,078 B2
(45) Date of Patent: Nov. 9, 2004

(54) SYSTEM AND METHOD FOR ESTIMATING POWER CONSUMPTION OF ELECTRIC APPARATUS, AND ABNORMALITY ALARM SYSTEM UTILIZING THE SAME

(75) Inventors: Takashi Onoda, Tokyo (JP); Yukio Nakano, Tokyo (JP); Katsuhisa Yoshimoto, Tokyo (JP)

(73) Assignee: Central Research Institute of Electric Power Industry, Tokyo (JP)

( * ) Notice: Subject to any disclaimer, the term of this patent is extended or adjusted under 35 U.S.C. 154(b) by 99 days.

(21) Appl. No.: 10/257,102

(22) PCT Filed: Apr. 12, 2001

(86) PCT No.: PCT/JP01/03168

§ 371 (c)(1),
(2), (4) Date: Oct. 8, 2002

(87) PCT Pub. No.: WO01/77696

PCT Pub. Date: Oct. 18, 2001

(65) Prior Publication Data

US 2003/0093390 A1 May 15, 2003

(30) Foreign Application Priority Data

Apr. 12, 2000 (JP) ........................................ 2000-111271

(51) Int. Cl.[7] .............................................. G08B 21/00
(52) U.S. Cl. ...................... 340/658; 340/660; 340/657; 340/870.11; 340/310.08; 340/656; 705/412
(58) Field of Search ................................ 340/658, 660, 340/657, 870.11, 310.08, 656; 705/412

(56) References Cited

U.S. PATENT DOCUMENTS 4,644,320 A * 2/1987 Carr et al. ............. 340/310.06
5,880,677 A * 3/1999 Lestician .................... 340/3.1
6,138,461 A * 10/2000 Park et al. ..................... 62/126
6,476,729 B1 * 11/2002 Liu ........................ 340/870.11

FOREIGN PATENT DOCUMENTS

| JP | 9-033570 | 2/1997 |
|----|----------|--------|
| JP | 2000292465 | 10/2000 |

OTHER PUBLICATIONS

International Search Report, May 28, 2001.

Non–Intrusive and Other End–Use Metering Systems, Sep. 23–24, 1998.

(List continued on next page.)

*Primary Examiner*—Daniel J. Wu
*Assistant Examiner*—Tai T. Nguyen
(74) *Attorney, Agent, or Firm*—Notaro & Michalos PC

(57) ABSTRACT

A method and a system for estimating electricity consumption of electric appliances and an abnormality alarm system, enabling estimation of individual electricity consumption of electric appliances in operation in a building or the like by a non-intrusive method, and comprising a measuring sensor (11), data extracting means (12), and estimating means (13) such as an LMC. The estimating means (13) learns based on a training set in advance, and is able to estimate individual electricity consumption of electric appliances in operation. Fundamental and higher harmonics of total load current and their phase differences from voltage are obtained by the data extracting means (12) from measurement data $V_A$, $V_B$, $I_A$, $I_B$ detected by an instrument transformer (111) and an instrument current transformer (112) provided in the vicinity of a service entrance 6 of a feeder 4 to a user 2. They are inputted to the estimating means (13) as inputs, thereby estimating individual electricity consumption of the electric appliances.

9 Claims, 7 Drawing Sheets

OTHER PUBLICATIONS

Heisei 10 nen Denki Gakkai, Denryoku Energy Bumon Taikai (Dai 9 Kai).
Heisei 10 nen Denryoku Chuo Kenkyusho Kenkyu Happyo-kai, Heisei 10 nen Nov. 20.
Denryoku Chuo Kenkysho Hokoku:T98045, Heisei 11 nen May.
Heisei 11 nen Denki Gakkai, Denryoku Energy Bumon Taikai (Dai 10 Kai).
FAN Symposium '99 in Fukui, Oct. 27, 1999 to Oct. 28, 1999.
Denryoku Chuo Kenkyusho Hokoku:R990004, Heisei 12 nen Mar.

* cited by examiner

SYSTEM AND METHOD FOR ESTIMATING POWER CONSUMPTION OF ELECTRIC APPARATUS, AND ABNORMALITY ALARM SYSTEM UTILIZING THE SAME

TECHNICAL FIELD

The present invention relates to a system and a method for estimating electricity consumption of an electric appliance, which can estimate individual electricity consumption of a plurality of electric appliances used in a household (user of electricity), and an abnormality alarm system of an electric appliance utilizing the same. More particularly, the present invention relates to a system and a method for estimating electricity consumption of an electric appliance, which estimate individual electricity consumption of a plurality of electric appliances by a non-intrusive way, and an abnormality alarm system for electric appliances utilizing the same.

TECHNICAL TERMS

In the present specification, a term "non-intrusive" means setting a measuring sensor at one position in the vicinity of an entrance of a feeder to a user and the state that the measuring sensor is not attached in accordance with each branch circuit on the downstream side of the feeder or it is not attached in accordance with each electric appliance connected to the circuit. Further, an inverter-driven appliance means an appliance which has an inverter mounted thereon and can continuously change the operation of the device from a low output to a high output. Electricity consumption of the inverter-driven appliance continuously varies from a small value to a large value in accordance with an output. Furthermore, a non-inverter appliance means an appliance which does not have an inverter mounted thereon and whose operation is simply limited to, e.g., On and Off. Electricity consumption of the non-inverter appliance takes a restricted value in accordance with on-off operation.

BACKGROUND ART

As a monitoring system which non-intrusively estimates the operating status of an electric appliance, EPRI (Electric Power Research Institute; US) has conventionally realized such an apparatus by using an algorithm developed in MIT (Massachusetts Institute of Technology; US). This monitoring system takes on-off operation of an electric appliance as temporal stepwise changes in a total load demand curve of a household, specifies an electric appliance which has been turned on or off, and estimates its operating status based on a rated electricity consumption and a rated power factor of the electric appliance. Therefore, an electric appliance which is simply turned on or off can be specified, and its operating status can be estimated.

In recent years, however, inverter-driven appliances such as an air conditioner have spread in general households, and it is often the case that both non-inverter and inverter-driven appliances are used in the same environment. Since the inverter-driven appliance controls an output in accordance with the load status, electricity consumption also varies in accordance with this control. Therefore, temporal transition of electricity consumption does not necessarily fluctuate in the step form, but it may fluctuate slowly or irregularly.

Thus, under the circumstance that the inverter-driven and the non-inverter appliances are both used, it is difficult not only to estimate individual electricity consumption of each electric appliance but also to estimate the operating status of the electric appliance by using the conventional monitoring system developed by EPRI mentioned above.

It is an object of the present invention to provide a system and a method for estimating electricity consumption of an electric appliance, which can non-intrusively estimate individual electricity consumption of a plurality of electric appliances used in a household under the circumstance that non-inverter and inverter-driven appliances or the like are both used. Moreover, it is another object of the present invention to provide a system which warns a malfunction arising in electric appliances used in a household.

DISCLOSURE OF INVENTION

To achieve this aim, the present inventor has paid attention to a pattern of harmonic currents generated by an electric appliance set in a household, and considered obtaining fundamental and higher harmonics of total load current and their phase differences from voltage based on total load current and voltage measured in the vicinity of a service entrance, thereby estimating electric appliances used in the household and their individual electricity consumptions. For example, they considered such estimation by applying a pattern recognition technique using an estimation algorithm such as a large margin classifier or a neural network.

It is well known that an electric appliance which has an inverter circuit and rectifiers therein generates harmonics inherent thereto. In addition, other than a simple resistance circuit, even though electric appliances have any circuit other than an inverter circuit and an rectifier circuit therein, most of such appliances generate harmonics inherent thereto. If the operating status of the electric appliances is the same, the electric appliances generate the same harmonics. Thus, the present inventor has conceived that, if the harmonics intruding to the user from the outside is the same, the operating status of electric appliances in the household can be estimated by checking fundamental and higher harmonics of total load current and their phase differences from voltage in the household.

According to the present invention, in view of the above-described conception, there is provided a method for estimating individual electricity consumption of a plurality of electric appliances used in a household, wherein there is previously created a model which estimates individual electricity consumption of electric appliances from the relationship between data concerning fundamental and higher harmonics of total load current and their phase differences from voltage based on total load current and voltage obtained from combinations of various use states of a plurality of the electric appliances and corresponding individual electricity consumptions of a plurality of electric appliances in service, and individual electricity consumption of electric appliances in operation is estimated by using the model with data concerning fundamental and higher harmonics of total load current and their phase differences from voltage based on total load current and voltage detected in the vicinity of a service entrance of a user. Additionally, according to the present, invention, there is provided a system which estimates individual electricity consumption of a plurality of electric appliances used in a household, the system comprising: a measuring sensor set in the vicinity of a service entrance to the user; data extracting means for fetching data concerning fundamental and higher harmonics of total load current and their phase differences from voltage based on total load current and voltage detected by the measuring sensor; and estimating means for estimating individual electricity consumption of electric appliances in service by previously creating a model which estimates individual electricity consumption of electric appliances from the relationship between data concerning fundamental and higher harmonics of total load current and their phase differences from voltage based on total load current and voltage obtained from combinations of various use states of a plurality of the electric appliances and corresponding electricity consumptions of the electric appliances in operation and receiving fundamental and higher harmonics of total load current and the phase differences from voltage as inputs.

In this case, when data concerning fundamental and higher harmonics of total load current and their phase differences from voltage in a household is obtained, it is possible to estimate individual electricity consumption of a plurality of electric appliances used in the household by utilizing a model which is previously configured to associate typical electric appliances' fundamental and higher harmonic currents and their phase differences from voltage or those acquired when arbitrarily combining and operating such electric appliances with corresponding individual electricity consumptions in service.

According to the present invention, only setting the measuring sensor in the vicinity of the outdoor service entrance can suffice, and the measuring sensor does not have to be set in accordance with each electric appliance to be measured. Therefore, there can be obtained an advantage of less degrees of violation of privacy or less additional wirings or the like when setting the present system to the household.

Further, in the system for estimating electricity consumption of an electric appliance according to the present invention, it is preferable that the estimating means generates a model which estimates an approximate electricity consumption curve, i.e., individual electricity consumptions of electric appliances by providing an estimation algorithm with a training set consisting of data concerning fundamental and higher harmonics of total load current and their phase differences from voltage based on total load current and voltage obtained from combinations of various use states of a plurality of electric appliances and combinations of individual electricity consumption in various operating status of these electric appliances and corresponding individual electricity consumptions of the electric appliances, which are solutions for the combinations, and performing learning on parameters of the electricity consumption curve.

As the training set in this case, some are selected from pairs of typical electric appliances or arbitrary combinations of such electric appliances and arbitrary combinations of the operating status with respect to them and individual electricity consumption of the electric appliances, which are solutions relative to such combinations. Then, by giving the training set to the estimation algorithm and causing it to learn in advance, the estimating means is set available. That is, the data concerning fundamental and higher harmonics of load current and their phase differences from voltage and corresponding electricity consumption of a plurality of electric appliances in service, which are obtained by operating typical electric appliances or arbitrarily combining and operating these electric appliances, are given as the training set to the estimation algorithm to have it learn in advance and make a model which estimates electricity consumption of individual electric appliances from the relationship between harmonics pattern and corresponding electricity consumption of a plurality of electric appliances in service obtained from combinations of various use states of a plurality of the electric appliances. As a result, it is possible to estimate electricity consumption of each electric appliance which is in service by using the model which can estimate electricity consumption of each electric appliance through the estimation algorithm even if unknown measurement data are inputted. Thus, when the data concerning fundamental and higher harmonics of total load current and their phase differences from voltage obtained by the measuring sensor provided in the vicinity of the service entrance to the user is actually fetched and given to the estimating means which is available after completion of learning as mentioned above, the estimating means can estimate individual electricity consumption of the electric appliances which are in service.

Therefore, individual electricity consumption of a plurality of the electric appliances used in the household can be estimated by the estimating means with data concerning fundamental and higher harmonics of total load current and their phase differences from voltage obtained from the data extracting means through the measuring sensor.

Here, as the estimating means, it is preferable to use an estimation algorithm of a large margin classifier or an estimation algorithm of a neural network. In particular, use of the large margin classifier can further improve the estimation accuracy with respect to combinations of the electric appliances including non-inverter appliances.

Furthermore, the above-described system for estimating electricity consumption of an electric appliance can be utilized for an abnormality alarm system which warns about malfunction of an electric appliance. This abnormality alarm system determines presence/absence of malfunction of an electric appliance or an electric system based on their individual electricity consumption obtained by the above-described system for estimating electricity consumption of an electric appliance. In this case, information about malfunction of an electrical appliance which may lead to a fire disaster, safety of residents in the household which can be detected from how a specific electric appliance is used, safety in the household or the like can be determined by the non-intrusive method and can be transmitted to the outside.

BEST MODE FOR CARRYING OUT THE INVENTION

The structure of the present invention will now be described in detail hereinafter based on the best mode for carrying out the invention.

A method for estimating individual electricity consumption of a plurality of electric appliances used in a household according to the present invention obtains fundamental and higher harmonics of total load current and their phase differences from voltage based on total load current and voltage measured in the vicinity of a service entrance to the user, and estimates a corresponding combination of electric appliances in operation and corresponding individual electricity consumption of these electric appliances. This method can be realized by a electricity consumption estimation system including, e.g., a measuring sensor provided in the vicinity of the service entrance to the user, data extracting means for fetching data concerning fundamental and higher harmonics of total load current and their phase differences from voltage based on total load current and voltage detected by this measuring sensor, and estimating means for estimating a combination of electric appliances in operation and individual electricity consumption of these electric appliances from the fundamental and higher harmonics of the total current and their phase differences from the voltage.

Figure 1:
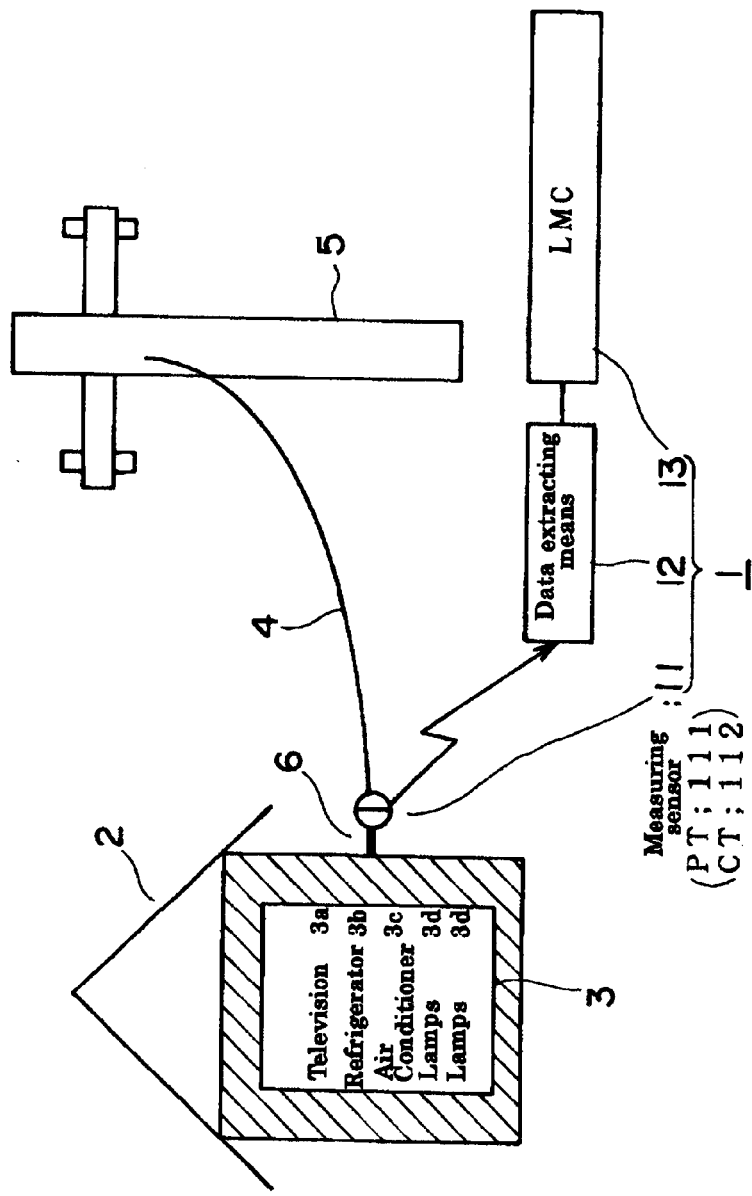
FIG. 1 is a view showing an electric system to which a system for estimating electricity consumption of an electric appliance according to the present invention is applied.
Figure 2:
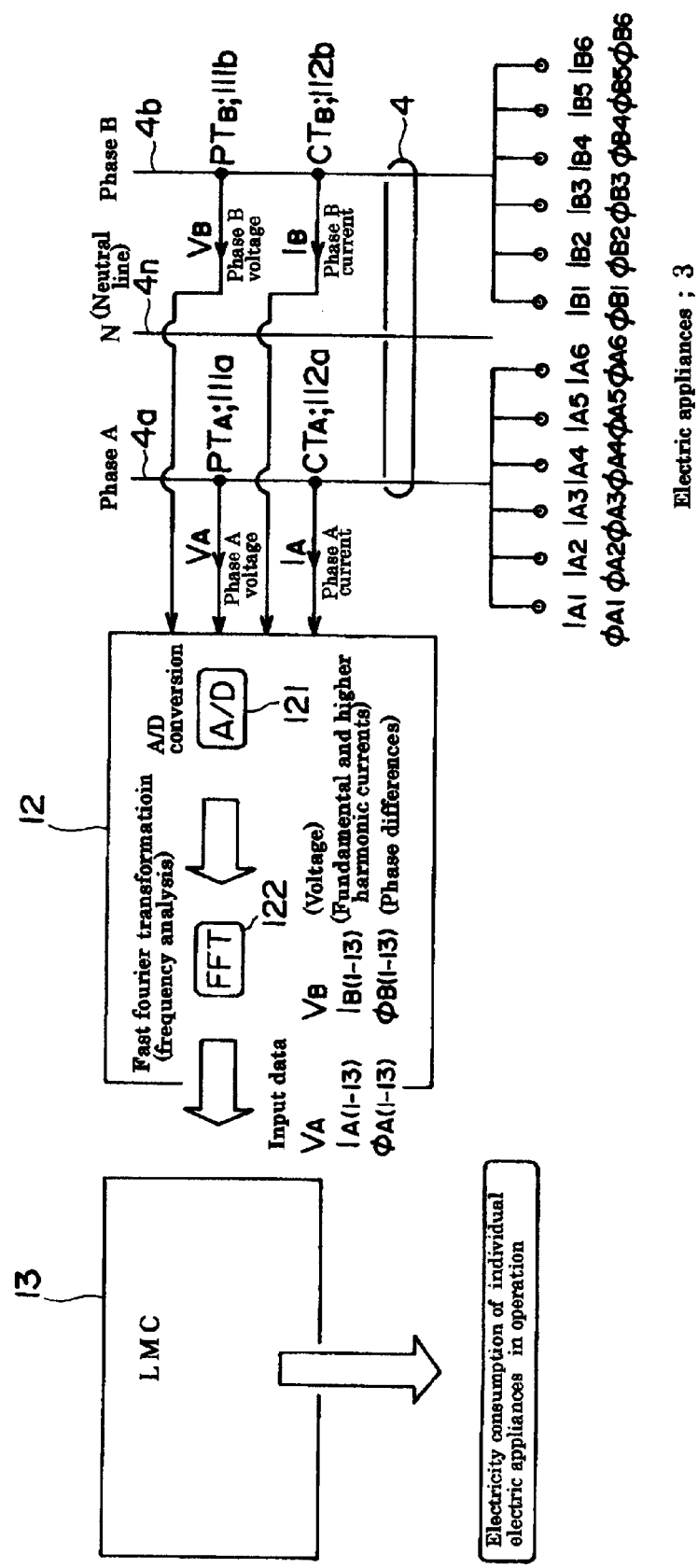
FIG. 2 is a block diagram showing an embodiment of the system for estimating electricity consumption of an electric appliance according to the present invention.

FIG. 1 is a type drawing of a distribution system to which the first embodiment of the electric appliance electricity consumption estimation system is applied, and FIG. 2 shows a concrete structural example of the electric appliance electricity consumption estimation system. The electric appliance electricity consumption estimation system 1 is an apparatus which is installed in the vicinity of a service entrance 6 to a user 2 and non-intrusively estimates individual electricity consumption of electric appliances 3, and it is connected to a power system of, e.g., an electric utility through a feeder 4 and an distribution line (not shown) suspended on a utility pole 5. Incidentally, there is presumed the case where inverter-driven and non-inverter appliances consisting of, e.g., a TV set 3a, a refrigerator 3b, an inverter-driven air conditioner 3c, a luminaire 3d consisting of incandescent lamps, a 3e consisting of fluorescent lamps and the like are connected to the feeder and used simultaneously.

The electric appliance electricity consumption estimation system 1 is basically composed of a measuring sensor 11, data extracting means 12, and estimating means 13 such as a large margin classifier (which will be abbreviated as LMC hereinafter) or a neural network (which will be abbreviated as NN hereinafter) which has completed learning. The LMC or NN functions as the estimating means by giving learning to an estimation algorithm.

The measuring sensor 11 is set only at one position in the vicinity of the service entrance 6 of the feeder 4 to a user 2 in order to provide a non-intrusive system. The measuring sensor 11 obtains voltage and current, and is constituted by, e.g., transformers and current transformers. In this embodiment, since carrying out the invention with respect to a general household in Japan, which uses a single-phase three-wire system 4, is taken as an example, the measuring sensor 11 is constituted by an instrument transformer for the phase A ($PTA_A$) 111a and an instrument transformer for the phase B ($PT_B$) 111b, and an instrument current transformer for the phase A ($CT_A$) 112a and an instrument current transformer for the phase B ($CT_B$) 112b.

Specifically, as shown in FIG. 2, the instrument transformer for the phase A 111a is connected between the phase A 4a and the neutral line 4n on the primary side, and outputs voltage $V_A$ similar to the voltage of the phase A 4a from the secondary side. The instrument transformer for the phase B 111b is connected between the phase B 4b and the neutral line 4n on the primary side, and outputs voltage $V_B$ similar to the voltage of the phase B 4b from the secondary side. Assuming that the through-type instrument current transformers for the phases A and B 112a and 112b are used, the instrument current transformer 112a measures the current flowing through the phase A 4a on the primary side and outputs a current $I_A$ similar to the current of the phase A from the secondary side, and the instrument current transformer 112b measures the current flowing through the phase B 4b on the primary side and outputs a current $I_B$ similar to the current of the phase B from the secondary side. Here, the phase relationship between the voltage $V_A$ and the current $I_A$ is equal to the phase relationship between the voltage of the phase A and the current of the phase A in principle, and the phase relationship between $V_B$ and $I_B$ is also maintained to be equal to the phase relationship between the voltage of the phase B and the current of the phase B in principle. The voltages $V_A$ and $V_B$ and the currents $I_A$ and $I_B$ are inputted to the data extracting means 12. Incidentally, the currents $I_{A1}, I_{A2}, \ldots I_{A6}$ with the phase differences $\phi_{A1}, \phi_{A2}, \ldots \phi_{A6}$ respectively are caused to flow between the phase A 4a and the neutral line 4n by the electric appliances 3 which are connected therebetween. Also, the currents $I_{B1}, I_{B2}, \ldots I_{B6}$ with the phase differences $\phi_{B1}, \phi_{B2}, \ldots \phi_{B6}$ respectively are caused to flow between the phase B 4b and the neutral line 4n by the electric appliances 3 which are connected therebetween.

The data extracting means 12 fetches data concerning fundamental and higher harmonics of total load current and their phase differences from voltage based on total load current and voltage detected by the measuring sensor 11. Specifically, the data extracting means 12 is, as shown in FIG. 2 for example, constituted by an analog/digital (A/D) converter 121 and a fast Fourier transformer 122. It converts the voltages $V_A$ and $V_B$ and the currents $I_A$ and $I_B$ inputted from the measuring sensor 11 into digital data. Then the harmonic currents $I_{A(1-13)}, I_{B(1-3)}$ and the phase differences $\phi_{A(1-13)}, \phi_{B(1-13)}$ are obtained by the fast Fourier transformer 122. Here, the currents $I_{A1}, I_{B1}$ are the fundamental harmonic currents. The phase differences $\phi_{A1}, \phi_{B1}$ are the fundamental harmonic phase differences from the respective fundamental voltages. The currents $I_{A(2-13)}, I_{B(2-13)}$ are the higher harmonic currents. The phase differences $\phi_{A(2-13)}, \phi_{B(2-13)}$ are the higher harmonic phase differences from the respective fundamental voltages. The subscript (2–13) expresses the second order to the 13th order of the harmonics. The frequency of the harmonics can be expressed by multiplying a fundamental frequency of the AC power supplied to the feeder by a value of its order. For example, when the fundamental frequency is 50 Hz, the third-order harmonic current means a current component having only a frequency component of 150 Hz. In general, since the odd harmonics prominently appears and the even harmonic wave is small, the odd harmonics data are inputted to the estimating means 13. The total load current data and the fundamental and higher harmonics of the total current and their phase differences from the voltage outputted from the data extracting means 12 are given to the above-described estimating means 13. It is to be noted that the total load current data ($I_A, I_B$) is also outputted from the data extracting means 12.

The estimating means 13 is an estimation algorithm which has completed learning by giving a training set thereto in advance, and estimates individual electricity consumption of the electric appliances 3 in operation by receiving the total load current data and the data concerning the fundamental and higher harmonics of the total current and their phase differences from the voltage. In case of this embodiment, the LMC is adopted as the estimating means 13, and a model which estimates individual electricity consumption of the electric appliances is created by giving the estimating means 13 the training set concerning the relationship between harmonics pattern and corresponding electricity consumption of individual electric appliances in operation obtained from combinations of various use states of a plurality of the electric appliances and having it learn in advance. Further, when the unknown total load current data measured by the measuring sensor 11 actually provided in the vicinity of the service entrance 6 of the user and the data concerning fundamental and higher harmonics of total load current and their phase differences from voltage are inputted, individual electricity consumption of a plurality of electric appliances used in the household is estimated by using the model which can estimate the electricity consumption of each electric appliance through the estimation algorithm.

The estimation of the electricity consumption in accordance with each electric appliance in the LMC 13 is carried out by the estimation algorithm which has completed learning in advance using the training set, which are the data by normalizing the currents $I_{A(1-13)}$, $I_{B(1-13)}$ and the phase differences $\phi_{A(1-13)}$, $\phi_{B(1-13)}$ of the fundamental and higher harmonics.

Figure 7:
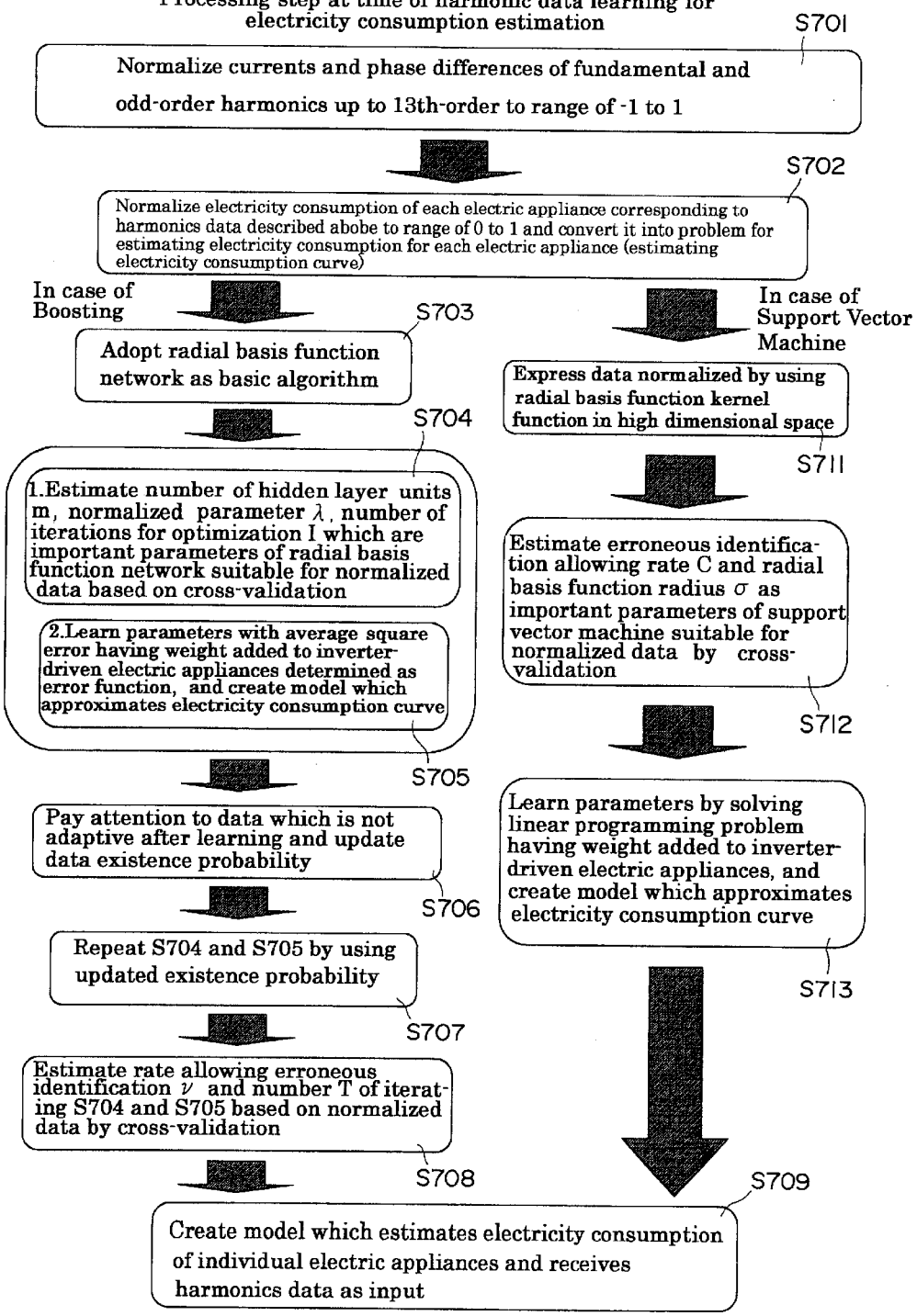
FIG. 7 is a flowchart for illustrating an example of a way which realizes an LMC used in the system for estimating electricity consumption of an electric appliance according to the present invention.

The estimating means of the LMC 13 can be realized by learning using a method such as boosting or a support vector machine illustrated in FIG. 7.

For example, as shown in FIG. 7, it is preferable to normalize the data concerning fundamental and odd-order harmonic current and their phase differences from voltage, whose units differ from each other, given as an input to the LMC 13 in order to equalize the weights of information, because the ranges of respective values differ from each other, namely, to have this data be able to be processed as data having the same influence. In this normalization, the current data is converted into [−1 to +1] and the phase data is converted into [−1 to +1] by using the periodic function such as a sine function (S701), for example. Then, the normalized data and the training set as the solution consisting of the data of the combinations of the electric appliances in operation and the corresponding individual electricity consumption data of the electric appliances in operation are inputted to the LMC 13 through the input device, and the LMC 13 is caused to learn. That is, the electricity consumption of each electric appliance relative to each harmonic data is normalized in the range of 0 to 1 to be converted into a problem to estimate the electricity consumption in accordance with each electric appliance (estimate an electricity consumption curve, namely, generate an approximate electricity consumption curve) (S702).

This is carried out by estimating the electricity consumption curve of each electric appliance relative to the harmonic data by using a boosting technique or a support vector machine technique, for example.

(A) Boosting (i) As a method for estimating a continuous input/output relationship for each electric appliance mentioned above, a radial basis function network which can be considered to be suitable for classification of measurement data is adopted as a basic algorithm (S703).

(ii) Then, with the radial basis function network, the number and values of parameters which are required to be learned in order to estimate the electricity consumption of each electric appliance are determined. Namely, when boosting is simply carried out, the hard margin which is also adapted to outlier data or misclassified data in the measurement data is formed, and the estimation capability relative to unknown data is thereby deteriorated. Therefore, in order to avoid adaptation to the outlier data or the misclassified data (avoid learning), the "the number of hidden layer units", the "regularization parameter" and the "the number of iterations for optimization" which are important parameters in the radial basis function network suitable for the normalized data are estimated based on cross-validation (S704). That is, since the recognition capability relative to test data is lowered in the hard margin, "allowance (regularization term)" which makes the hard margin to the large margin is estimated.

(iii) Moreover, an average square error having weight added to the inverter-driven appliance is determined as an error function to learn the parameters, and a model which approximates the electricity consumption curve is generated, namely, an approximate electricity consumption curve is generated (S705). That is, although the parameters which estimate a continuous input/output relationship are learned in accordance with each appliance, weight is attached to the inverter-driven electric appliance and the parameters are learned in detail since the inverter-driven appliances have a large quantity of electricity consumption.

(iv) After learning, attention is paid to data which is hardly adapted, and the existence probability of the data is updated (S706). That is, the weight (existence probability) of the measurement data which greatly deviates from the continuous input/output relationship estimated for each appliance is increased.

(v) S704 and S705 are repeatedly performed by using the updated existence probability (S707). That is, the data with the weight of the updated measurement data changed is used to create the new input/output continuous relationship.

(vi) "Rate of data which does not have to be learned" and "the number of iterations of repeating S704 and S705" are estimated based on the normalized databy cross-validation (S708). That is, updating of the data is prevented from being endlessly repeated, by setting a rate of data which does not have to be learned v and the number of iterations T based on the normalized parameters.

(vii) A model used for estimating the electricity consumption of each electric appliance with the harmonic data as an input is created (S709). That is, a continuous relationship of the input and output estimated in accordance with each appliance is integrated for each appliance, and the continuous relationship between the harmonic pattern and the electricity consumption of each appliance is created.

(B) Support Vector Machine (i) A radial basis function kernel function (for example, a Gaussian distribution function) is used to express the measurement data in a high dimensional space in which linear discriminant is enabled from an observation space (S711). That is, the radial basis function kernel function is applied to the normalized harmonic current value, the phase data and the normalized electricity consumption (an expression of data in a high dimensional space).

(ii) The linear discriminant is carried out in a high dimensional space, and the "rate of data which does not have to be learned" and the "width of a radial basis function" are adopted as parameters forming the large margin in the measurement data space. That is, the "rate of data which does not have to be learned" and the "width of the radial basis function" as the important parameters of the support vector machine suitable for the normalized data are estimated based on cross-validation (S712). When the support vector machine is simply carried out, the hard margin which is also adaptive for outlier data or misclassified data in the measurement data is formed, thereby lowering the recognition capability with respect to unknown (test) data. Thus, the "allowance" for making the hard margin to the large margin is estimated. That is, parameters (σ of the radial basis function kernel function and a parameter C which determines the measurement data which does not have to be considered), which determine the accuracy for estimating the continuous relationship of the input and the output of each appliance, are determined by the cross-validation.

(iii) A linear programming problem adding weight to the inverter-driven appliance is solved to learn the parameters, and a model which approximates the electricity consumption curve is generated, namely, the approximate power consumption curve is generated (S713). That is, although the linear programming problem which estimates the continuous relationship of the input/output of each appliance with a given allowance is constituted in accordance with each appliance by using the normalized measurement data and the parameters determined at S712, a quantity of electricity consumption of the inverter-driven electric appliance is large, and hence the parameters are learned in detail with weight attached thereto. The parameters are learned and the parameters are estimated by solving the linear programming problem (this becomes the continuous relationship of the input/output estimated in accordance with each appliance).

(iv) Then, a model which estimates the electricity consumption of each electric appliance which receives the harmonic data as an input is generated (S709). That is, the continuous relationship between the harmonic pattern and the electricity consumption estimated for each appliance at S713 is determined as the estimation model. In this manner, the estimating means 13 consisting of the LMC is created by learning.

Further, concrete learning of the LMC 13 will now be described based on a learning circuit, a harmonics pattern or the like illustrated in FIGS. 3 to 6.

Figure 3:
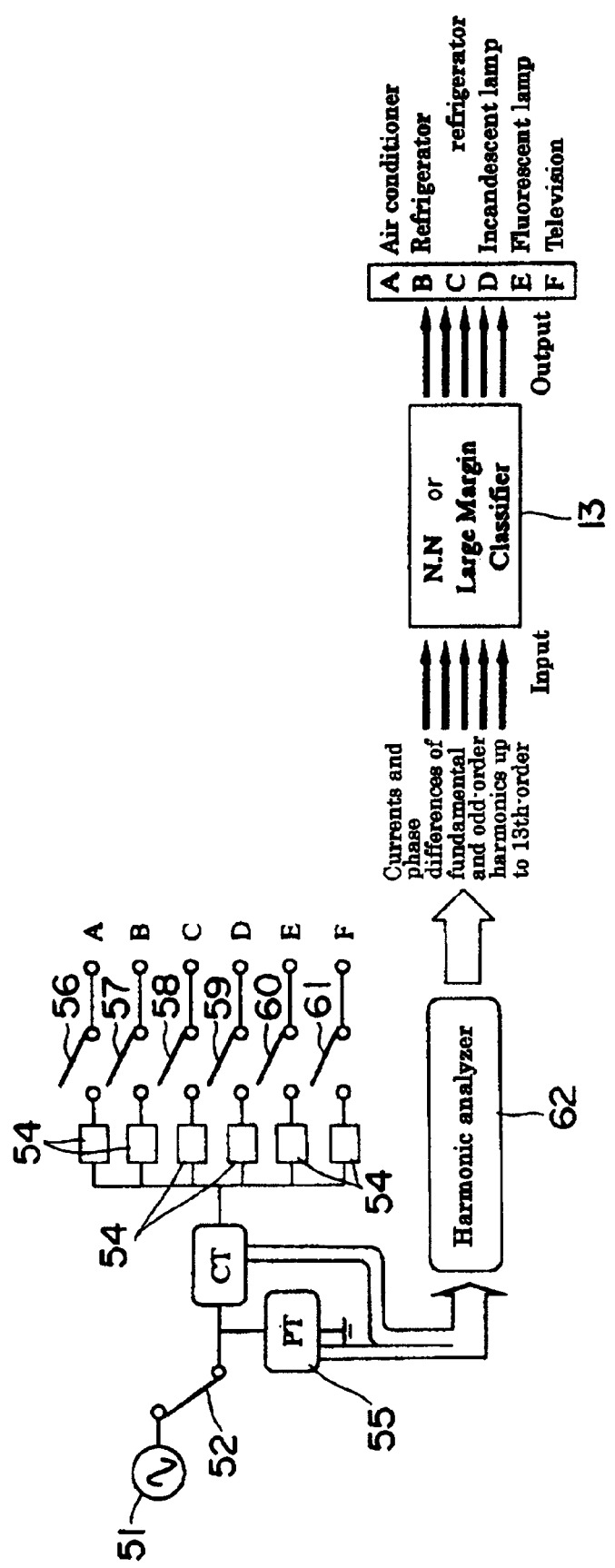
FIG. 3 is a circuit diagram showing a learning circuit which gives a training set to the system for estimating electricity consumption of an electric appliance illustrated in FIG. 2.

FIG. 3 shows an example of a learning circuit for causing the LMC to learn. As shown in FIG. 3, the learning circuit includes: a sine wave power supply (50 Hz, 100 V, 2 kVA) 51; a switch 52; an instrument current transformer 53 for measuring total load current; instrument current transformers 54 for measuring current of individual load; an instrument transformer 55 for measuring voltage; on-off switches 56, 57, . . . , 61 for changing operating status of individual load; loads A, B, . . . , F; a high-frequency analyzer 62; and the LMC 13. The LMC 13 is configured to receive the input and the training set through an input unit (not shown). Here, as the load A, B, . . . , F, a combination of typical inverter-driven appliances and non-inverter appliances shown in TABLE 1 are adopted. They are generally used in a household. Then, various combinations of use states of the loads A to F are given to the LMC 13 by turning on/off the switches 56, 57, . . . , 61 and arbitrarily setting current of the inverter-driven appliances (for example, the current can be varied by changing temperature setting of the room in the case of the inverter-driven air conditioner) or current of the non-inverter appliances (for example, the current can be varied by increasing/decreasing the number of lighting lamps in case of the incandescent lamps).

TABLE 1

| Load No. | Load | Conditions |
| --- | --- | --- |
| A | Inverter-driven air conditioner (up to approximately 1000 W) | 0 to 100% (change at every 5 to 10% step) |

TABLE 1-continued

| Load No. | Load | Conditions |
| --- | --- | --- |
| B | Inverter-driven refrigerator (up to approximately 220 W) | 0 to 100% (change at every 5 to 10% step) |
| C | Old type refrigerator (up to 150 W) | Compressor ON/OFF. Unplugging |
| D | Incandescent lamps (100 W × 10) | 0 to 100% (change at every 200 W step) |
| E | Fluorescent lamps (20 W × 10) | 0 to 100% (change at every 40 W step) |
| F | Color TV set (usually approximately 80 W) | ON/OFF. Standby mode |

Figure 4:
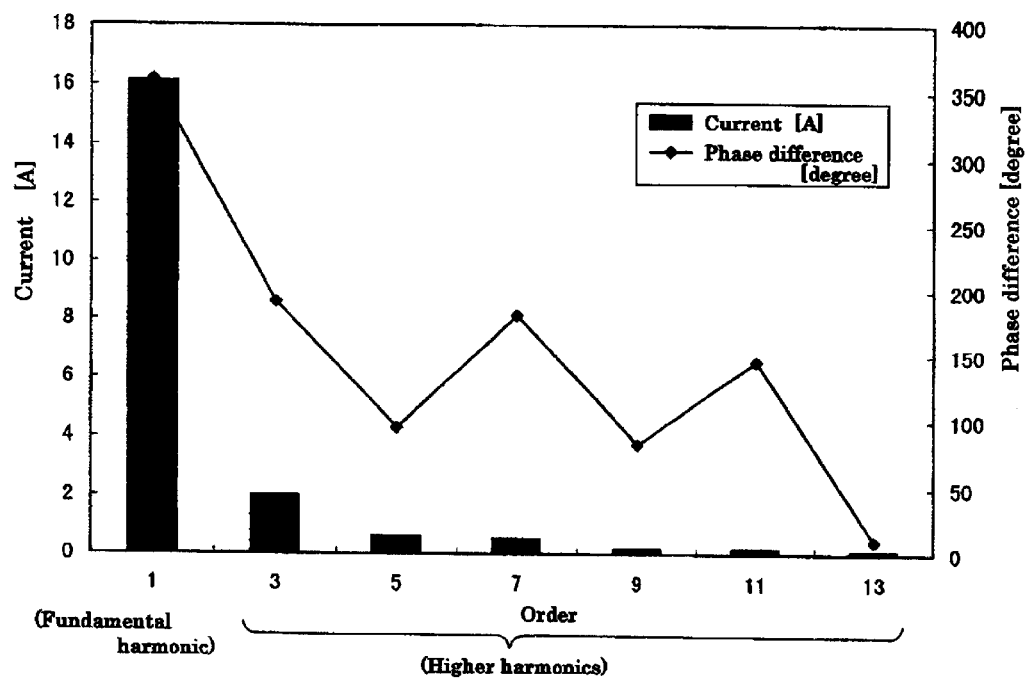
FIG. 4 is a view showing an example of a harmonics pattern.

Here, giving description on the use states of a plurality of electric appliances and the corresponding patterns of current and phase difference from voltage for fundamental and higher harmonics of total load current, they are represented as follows. For example, when the number of lamps lit of the incandescent lamps of the load D is six (600 W), the color TV set of the load F is turned on (80 W) and the inverter-driven air conditioner is operated at 95% output (950 W), the patterns of current and phase difference from voltage for fundamental and higher harmonics can be obtained as shown in FIG. 4, for example. In FIG. 4, the phase difference forms a pattern as follows. It becomes maximum at the fundamental harmonic, and the third-order harmonic, the seventh-order harmonic and the 11th-order harmonic have substantially the same value. The fifth-order and the ninth-order harmonics have smaller values, and the 13th-order harmonic is the smallest. Further, as to harmonic current, it forms a pattern that the third-order component shows relatively large value as compared with those of the fifth and the following orders.

Figure 5:
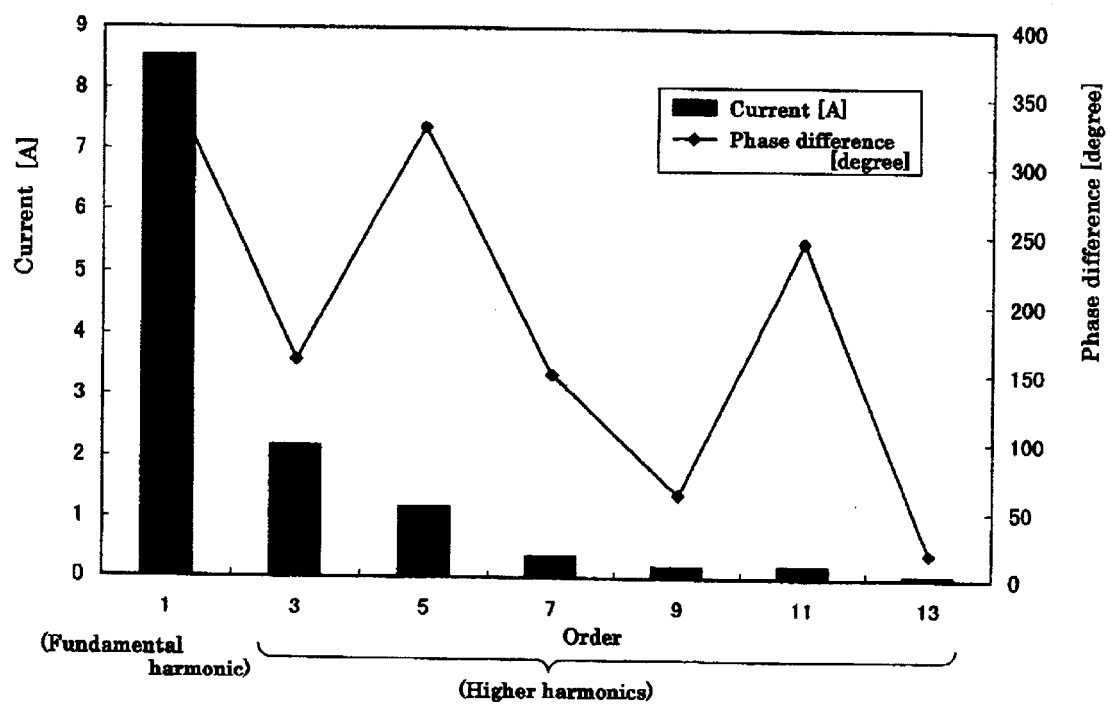
FIG. 5 is a view showing another example of a harmonics pattern.

Furthermore, for example, when the load D is 600 W, the load F is 80 W and the inverter-driven refrigerator of the load B is operated at 95% output (using 209 W), the patterns of current and phase difference for fundamental and higher harmonics as shown in FIG. 5 can be obtained. In FIG. 5, the fundamental harmonic has the largest phase difference, and the fifth-order harmonic and the 11th-order harmonic have the second and third phase differences, respectively. Moreover, the phase difference forms a pattern that the fifth-order harmonic, the seventh-order harmonic, the ninth-order harmonic and the 13th-order harmonic are reduced by half, and these harmonics sequentially becomes smaller. Further, as to harmonic current, it forms a pattern that the third-order harmonic current and the fifth-order harmonic current are larger than other harmonic current components, and indicating values which sequentially become smaller as the order becomes higher.

Figure 6:
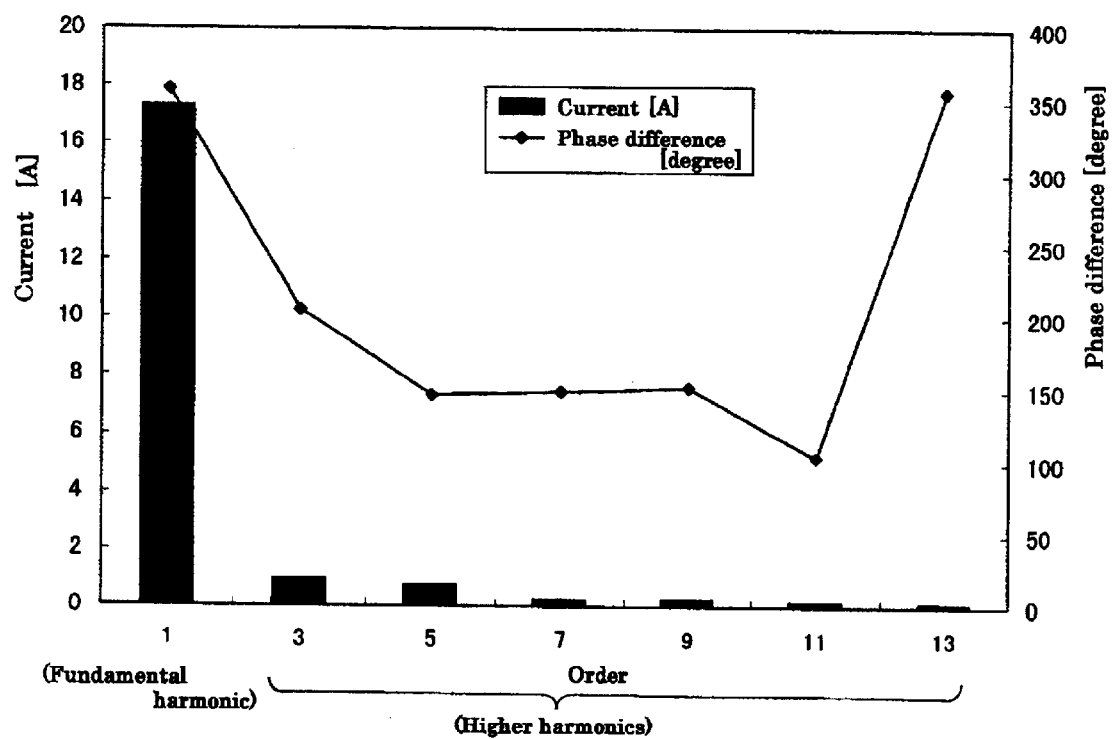
FIG. 6 is a view showing an example of a harmonics pattern.

In addition, for example, in operation state that the load D is 600 W, the load E is 180 W and the load A is 1000 W, the harmonic current and phase difference patterns as shown in FIG. 6 can be obtained. In FIG. 6, the fundamental harmonic and the 13th-order harmonic have the substantially maximum phase difference, and the phase differences at any other harmonics become relatively small. A substantially U-shaped pattern can be obtained. Additionally, as to harmonic current, it forms a pattern that the harmonic current components including the third-order harmonic component show considerably small values as a whole.

When a plurality of the electric appliances are combined and used in various operating status in this manner, the inherent current and phase different patterns are involved in accordance with the combination or the operating status. Thus, it is possible to obtain the estimating means by providing the estimation algorithm with a training set consisting of the total load current data, the data concerning fundamental and higher harmonics of total load current and their phase differences from voltage and the individual electricity consumption data of the electric appliance, and causing the estimation algorithm to learn in advance. The training set is a set of solutions with respect to various kinds of combinations of a plurality of typical electric appliances (including the non-inverter appliances and the inverter-driven appliances) and combinations of the individual electricity consumption in various operating status.

Incidentally, as to the training set for learning, the present invention is not restricted to that in this example, and it is good enough to prepare some sets of data for combinations of appropriate electric appliances and combinations of appropriate operating status.

In estimation of the electricity consumption in the LMC 13, the electricity consumption of individual electric appliance is estimated, as an output of the model which can estimate the electricity consumption of individual electric appliance by using the estimation algorithm, by inputting combinations of unknown total load current data and unknown data concerning fundamental and higher harmonics of total load current and their phase differences from voltage to the model which estimates the electricity consumption of each electric appliance.

Incidentally, as to the electricity consumption of the electric appliances which are not stored in the data base, it is displayed as that of an unknown electric appliance.

According to the electric appliance electricity consumption estimation system 1 configured as described above, the individual electricity consumption of the electric appliances 3 actually used by the user 2 can be non-intrusively estimated as described below.

That is, the unknown measurement data (voltages $V_A$, $V_B$ and currents $I_A$, $I_B$) from the measuring sensor 11 provided in the vicinity of the service entrance is fetched from the data extracting means 12, then the harmonic current data $I_{A(1-13)}$, $I_{B(1-13)}$, the phase difference data $\phi_{A(1-13)}$, $\phi_{B(1-13)}$ and the total load current data are obtained by the fast Fourier transformer 122, and they are inputted to the LMC 13 which is a model to estimate the electricity consumption of individual electric appliance by learning on combinational use of typical electric appliances in advance, and the individual electricity consumption of the electric appliances 3 (non-inverter appliances, inverter-driven appliances) in operation can be estimated and outputted as an output from the model which estimates the electricity consumption of each electric appliance.

The estimated electricity consumption data of the electric appliances in operation can be utilized by the user 2 itself or by the electric utility such as an electric power company through a communication line, and it can be used as information on abnormality of electric appliances.

For example, it can be expected, at the beginning of the 21st century, that various kinds of information services are provided to the user 2, information on the user 2 side is collected through a network, and these types of information is reflected to management of the electric utility. For example, there is information concerning the composition of an electric appliance owned by the user 2 or the actual situation of use as information on the user side 2 which is important for the electric utility, such information is critical for evaluation of the effect of DSM (Demand Side Management), prediction of the potential demand, analysis of a cause of lowering of load factor, construction of meticulous seasonal and time-of-use rates system, provision of various kinds of services to the utility customer 2, and the like. It can be said that the electric appliance electricity consumption estimation system 1 is one of influential systems which can satisfy the above-described needs.

In addition, although description has been mainly given as to non-intrusive estimation of the individual electricity consumption of the electric appliances in this embodiment, the present invention is not restricted to a certain utilization method in particular, and it can be used for warning about malfunction of electric appliances. That is, for example, when abnormality is determined by a comparison between the usual electricity consumption and information concerning the electricity consumption obtained by the electric appliance electricity consumption estimation system, safety of residents in the household, safety in the household, or presence/absence of abnormality of electric appliances or electric systems can be determined, and its information can be transmitted to the outside. For example, "safety of residents in the household" can be determined based on the operating status of luminaires, a TV set, an electric pot, a douche and air dryer for attachment to a toilet or the like which must be turned on/off by a resident in the household every day by using the present system, and "safety in the household" can be determined based on a long-term use (keeping on) of an electric iron, an electric heater, an electrified kitchen or the like which may be a factor of a fire disaster. As to "transmission of the information to the outside", an existing telephone line, a PHS, a pager, the Internet or the like can be utilized and, as "target of notification", a resident in the household him/herself, a relative of that person, a fire department, a person who is in charge of the welfare and health care in a local authority or the like can be assumed.

Incidentally, although the foregoing embodiment is an example of the preferred embodiment according to the present invention, the present invention is not restricted thereto, and various kinds of modifications can be carried out without departing from the scope of the invention. For example, although the description has been mainly given as to the case where the estimation algorithm such as the LMC is adopted as the estimating means 13 in the above embodiment, the present invention is not restricted thereto, and it is possible to employ a pattern matching method based on a table look-up using very large data obtained by setting typical electric appliances or arbitrary combinations of the electric appliances and combinations of the operating status of these electric appliances, for example. Further, the estimating means itself is not required in some cases, and combinations of the electric appliances in operation and the individual electricity consumption thereof can be estimated from the characteristic of the harmonic patterns obtained by measurement in this case. Moreover, when utilizing the estimation algorithm as the estimating means 13, although the description has been mainly given as to the case where the LMC is adopted, the present invention is not restricted thereto, and any other estimating means, e.g., a neural network can be utilized. As the estimating means utilizing the NN, it is preferable in particular to use a hierarchical neural network which can make an approximation for a continuous function through learning. It is to be noted that the system for estimating the electricity consumption of electric appliances according to this embodiment has completely the same structure as the first embodiment except that the NN is used as the estimating means 13. Incidentally, learning by the hierarchical neural network is referred to as an error back-propagation method, and modifies a coupling coefficient in the NN in such a manner that an output pattern coincides with a target output (a training set) when a input pattern is given.

Although estimation using the neural network especially demonstrates the effect for estimation for inverter-driven appliances, the electricity consumption of the individual operating appliance can be estimated when both the inverter-driven and non-inverter appliances are used simultaneously. Furthermore, as similar to the first embodiment, the estimating means, which is caused to learn by using the training set and associates the input pattern with the output pattern, is constructed, and the individual electricity consumption of the electric appliances 3 set in the household can be estimated based on the non-intrusive method by using the estimating means.

The second embodiment described above can also demonstrate effects and advantages similar to those of the first embodiment such that the individual electricity consumption of each appliance in operation can be estimated when both the inverter-driven and non-inverter appliances are used simultaneously.

Furthermore, the electric appliance electricity consumption estimation system 1 according to the present invention can perform learning to improve the estimation accuracy of the LMC 13 (or the neural network) from the outside of the user 2 by utilizing a regular telephone line, an optical fiber dedicated line or the like.

What is claimed is:

1. A method for estimating individual electricity consumption of a plurality of electric appliances used by a user, said method comprising: previously creating a model for estimating electricity consumption of each electric appliance from relationship between data concerning fundamental and higher harmonics of total load current and their phase differences from voltage from said total load current and voltage obtained from combinations of various use states of a plurality of electric appliances and electricity consumption of a plurality of said electric appliances used in obtaining said data; and obtaining electricity consumption of individual electric appliance in operation by using said model for estimating electricity consumption of each electric appliance from said fundamental and higher harmonics of said total load current and said their phase differences from voltage obtained from said total load current and voltage measured in a vicinity of a service entrance into said user.

2. An electric appliance electricity consumption estimation system for estimating individual electricity consumption of a plurality of electric appliances used by a user, said system comprising: a measuring sensor set in a vicinity of a service entrance into said user; data extracting means for fetching data concerning fundamental and higher harmonics of total load current and their phase differences from voltage obtained from said total load current and voltage detected by said measuring sensor; and estimating means for estimating individual electricity consumption of electric appliances in operation by using a model, said model being previously created for estimating electricity consumption of each electric appliance from relationship between data concerning said fundamental and higher harmonics of said total load current and said their phase differences from voltage from said total load current and voltage obtained from combinations of various use states of a plurality of electric appliances and electricity consumption of a plurality of said electric appliances used in obtaining said data, and by receiving said fundamental and higher harmonics of said total load current and said their phase differences from voltage as inputs.

3. The electric appliance electricity consumption estimation system according to claim 2 wherein said estimating means can be obtained by providing an estimation algorithm with a training set consisting of data concerning said fundamental and higher harmonics of said total load current and said their phase differences from voltage from said total load current and voltage obtained from said combinations of various use states of a plurality of electric appliances and individual electricity consumption data of said electric appliances, which is a set of solutions, with respect to various kinds of combinations of a plurality of electric appliances and combinations of individual electricity consumption in various operating status of said electric appliances, and causing said estimation algorithm to learn parameters of an electricity consumption curve to generate an approximate electricity consumption curve.

4. The electric appliance electricity consumption estimation system according to claim 3, wherein said estimating means uses an estimation algorithm of a large margin classifier.

5. An abnormality alarm system which determines safety of a resident in a household, safety in said household, presence/absence of abnormality of electric appliances or electric systems from an operating status of said electric appliances obtained by said electric appliance electricity consumption estimation system set forth in claim 4 and transmits information about the determination to an outside.

6. The electric appliance electricity consumption estimation system according to claim 3 wherein said estimating means uses an estimation algorithm of a neural network.

7. An abnormality alarm system which determines safety of a resident in a household, safety in said household, presence/absence of abnormality of electric appliances or electric systems from an operating status of said electric appliances obtained by said electric appliance electricity consumption estimation system set forth in claim 6 and transmits information about this determination to an outside.

8. An abnormality alarm system which determines safety of a resident in a household, safety in said household, presence/absence of abnormality of electric appliances or electric systems from an operating status of said electric appliances obtained by said electric appliance electricity consumption estimation system set forth in claim 3 and transmits information about this determination to an outside.

9. An abnormality alarm system which determines safety of a resident in a household, safety in said household, presence/absence of abnormality of electric appliances or electric systems from an operating status of said electric appliances obtained by said electric appliance electricity consumption estimation system set forth in claim 3 and transmits information about this determination to an outside.

* * * * *

UNITED STATES PATENT AND TRADEMARK OFFICE
CERTIFICATE OF CORRECTION

PATENT NO. : 6,816,078 B2
DATED : November 9, 2004
INVENTOR(S) : Takashi Onoda et al.

It is certified that error appears in the above-identified patent and that said Letters Patent is hereby corrected as shown below:

Column 14,
Line 49, change "claim 3" to -- claim 2 --.

Signed and Sealed this

Eighth Day of March, 2005

JON W. DUDAS
*Director of the United States Patent and Trademark Office*